United States Patent [19]
Greenfield et al.

[11] Patent Number: 5,679,929
[45] Date of Patent: Oct. 21, 1997

[54] ANTI-BRIDGING PADS FOR PRINTED CIRCUIT BOARDS AND INTERCONNECTING SUBSTRATES

[75] Inventors: Douglas Wayne Greenfield, Concord; Richard Paul Yorkovich, Mt. Gilead, both of N.C.

[73] Assignee: Solectron Corporqtion, Milpitas, Calif.

[21] Appl. No.: 508,739

[22] Filed: Jul. 28, 1995

[51] Int. Cl.⁶ .................................................. H05K 1/02
[52] U.S. Cl. .................... 174/261; 361/767; 361/777; 228/180.1
[58] Field of Search ................................ 361/767, 768, 361/774, 777, 760; 174/261, 260, 250, 262; 228/180.21, 180.22, 180.1, 179.1

[56] References Cited

U.S. PATENT DOCUMENTS

| | | | |
|---|---|---|---|
| 3,567,844 | 3/1971 | Kremar | 174/68.5 |
| 4,339,784 | 7/1982 | Shearer | 361/403 |
| 4,694,121 | 9/1987 | Ota | 174/68.5 |
| 4,835,345 | 5/1989 | Haarde | 174/68.5 |
| 4,851,614 | 7/1989 | Duncan, Jr. | 174/68.5 |
| 4,891,472 | 1/1990 | Veurman et al. | 174/68.5 |
| 4,893,216 | 1/1990 | Hagner | 361/406 |
| 5,067,042 | 11/1991 | Nagano | 361/406 |
| 5,227,589 | 7/1993 | Weeks | 174/263 |
| 5,242,100 | 9/1993 | Weeks | 228/180.1 |
| 5,243,143 | 9/1993 | Throop et al. | 174/263 |
| 5,307,980 | 5/1994 | Belanger, Jr. | 228/56.3 |
| 5,330,096 | 7/1994 | Belanger, Jr. | 228/180.22 |
| 5,446,244 | 8/1995 | Kawanabe et al. | 174/261 |
| 5,490,325 | 2/1996 | Niemann et al. | 29/846 |

*Primary Examiner*—Laura Thomas
*Attorney, Agent, or Firm*—Wilson Sonsini Goodrich & Rosati

[57] ABSTRACT

The present invention provides anti-bridging pad(s) for wave soldering of interconnecting substrates. In particular, the present invention provides interconnecting substrates (e.g. printed circuit board) having anti-bridging pad(s) which substantially conform to trailing pad(s), have geometries and/or placements with respect to trailing pad(s) in an array of functional pads which reduce or eliminate solder bridging.

15 Claims, 8 Drawing Sheets

ANTI-BRIDGING PADS FOR PRINTED CIRCUIT BOARDS AND INTERCONNECTING SUBSTRATES

BACKGROUND OF THE INVENTION

The present invention relates to wave soldering of printed circuit boards and interconnecting substrates. In particular, the present invention relates to wave soldering of printed circuit boards and interconnecting substrates having at least one anti-bridging pad to reduce or eliminate solder bridging.

An interconnecting substrate, for example, a printed circuit board typically consists of a custom built laminate structures of at least one electrically insulating layer (e.g. a glass-filled epoxy, phenolic, polyimide, etc.) and a plurality of electrically conducting layers (e.g. copper, aluminum, conductive inks, etc). A printed circuit board is used to interconnect various integrated circuits also referred to as chips. In a pin-through-hole connection, the chip is connected to the printed circuit board by an array of pins which are inserted into corresponding holes in the board. In a surface mount connection, the chip is connected to the printed circuit board by soldering an array of leads on a corresponding set of conductive pads on the surface of the board. Either type of connection can be established by the wave soldering process.

Typically, in wave soldering, a solder flux is necessary to activate the conductive surfaces to make them wettable. Any conventional solder flux can be used for this purpose. For example, LONCO 3355-11 made by Alpha Metals Inc. in Jersey City, N.J. can be used. Next, the printed circuit board is preheated, typically on the bottom side, to a top side temperature of about 210°–220° F. to drive off the inert carriers in the flux and to reduce thermal shock between the printed circuit board and the molten solder wave and activate the flux. Afterward, the board travels on a conveyor belt over the molten solder wave so the bottom of the printed circuit board contacts the solder. While in contact with the board, the molten solder will flow into gaps between adjacent metallic surfaces forming electrical connections between the electronic components and the board.

The first edge of the printed circuit board to enter the molten solder wave is referred to as the leading edge; and the last edge to exit the wave is referred to as the trailing edge. The printed circuit board typically includes one or more array of pins or pads to be soldered. The last functional pad (or last set of functional pads) to exit from the solder bath are referred to as the trailing pads and the closest functional pad thereto is referred to as the adjacent pad. It should be understood that the phrase "functional pad" is intended to include various conductive solder joint attachments capable of being part of a circuit associated with an interconnecting substrate. For example, the functional pad may constitute a land around the barrel of a pin-through-hole attachment or a rectangular shaped pad on a printed circuit board for a surface mount attachment. It should be understood that the phrase "anti-bridging pad" is intended to encompass any conductive surface associated with an interconnecting substrate such as a printed circuit board which can be wetted by solder whose primary function is to reduce or eliminate solder bridging.

Wave soldering can form undesired bridges of solder between the adjacent functional pads producing an electrical short. Typically, a solder bridge will occur between the trailing pad and an adjacent pad as defined earlier. The closer the spacing of the pads the more likely that bridging will occur. As the industry moves to higher density circuitry and more closely spaced pins and pads, such as 0.05 inch center-to-center pin spacing, interstitial connectors, and interstitial pin grid arrays, solder bridging becomes a more significant problem. Another factor exacerbating the problem is the electronic industry's trend to use fluxes with no clean chemistries and reduced solids content to eliminate the need to remove residual flux after wave soldering. The elimination of this removal step eliminates cleaning costs and reduces pollution but may increase the tendency for solder bridging to occur.

FIGS. 1A–F illustrate some known arrangements for the shapes of the non-functional pads 1, 3, 5, 7 with respect to the trailing pads 2, 4, 6, and 8 of an array of the functional pads 14. None of these arrangements are believed to fully eliminate the bridging of solder between closely spaced pins or pads such as being found in today's designs.

SUMMARY OF THE INVENTION

The present invention provides at least one anti-bridging pad on an interconnecting substrate (e.g. printed circuit board), the pad having a certain geometric shape and/or placement with respect to a trailing pad which greatly reduces or even eliminates solder bridging. In one embodiment, an anti-bridging pad is disposed between the trailing pad and the trailing edge of the board wherein at least one point on the edge of the anti-bridging pad is less than 0.03 inches from the closest point on the edge of the trailing pad. In another embodiment, the anti-bridging pad substantially corresponds to an edge of the trailing pad. In another embodiment, the anti-bridging pad includes a serrated edge facing the trailing pad. In another embodiment, an anti-bridging pad includes a point on a finger which is closer to a line intersecting the board perpendicular to the conveyor direction and in front of the trailing pad than a point on the trailing pad.

DETAILED DESCRIPTION OF THE PREFERRED EMBODIMENTS

It has been discovered that certain geometric shapes and/or placement of anti-bridging pads with respect to an array of functional pads will greatly reduce the incidence or even eliminate any solder bridging between the functional pins and pads during the wave soldering process of an interconnecting substrate such as a printed circuit board. For the sake of simplicity the present invention will be described in the context of a printed circuit board. However, anti-bridging pads have application to other types of interconnecting substrates such as ceramic cards and hybrid technology. The anti-bridging pad, also sometimes referred to as a solder thief or a solder robber, is believed to promote the peeling of excess solder from about the trailing pads.

Figure 1A:
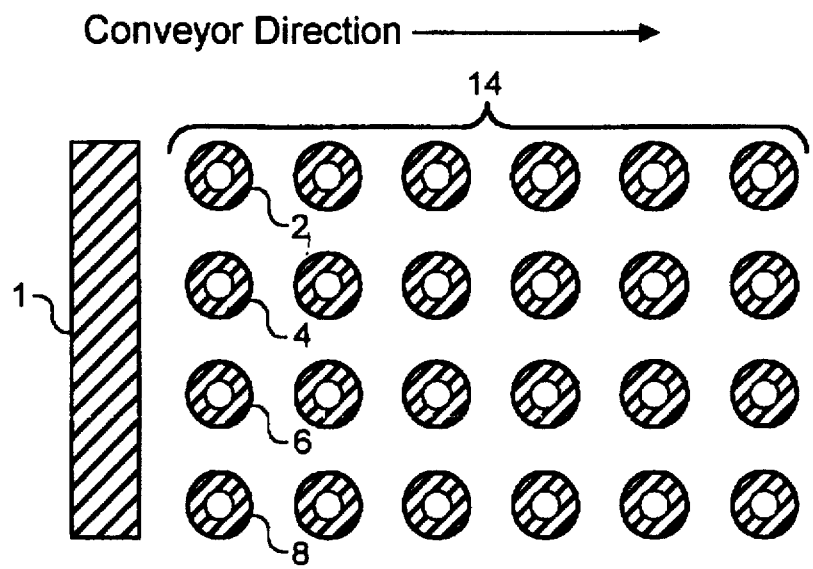
FIGS. 1A–F illustrate conventional arrangements for non-functional pads with respect to the trailing pads of an array.
Figure 1B:
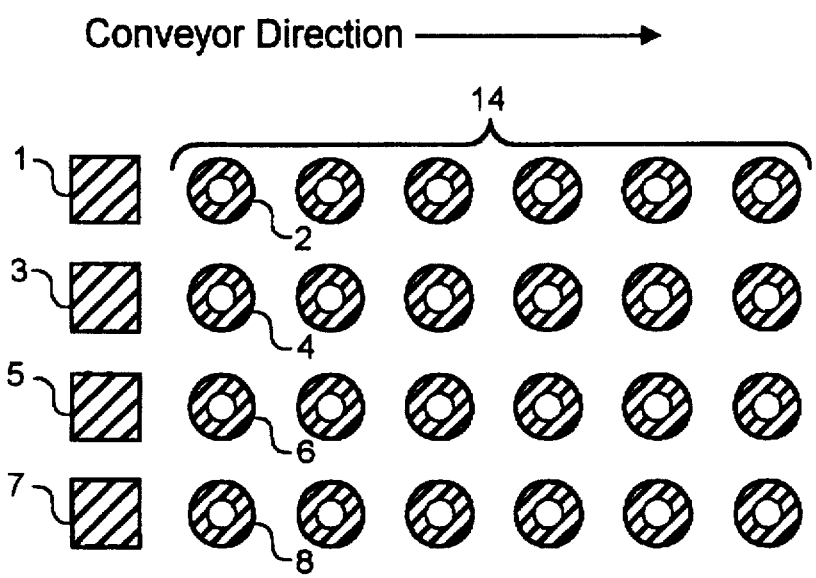
Figure 1C:
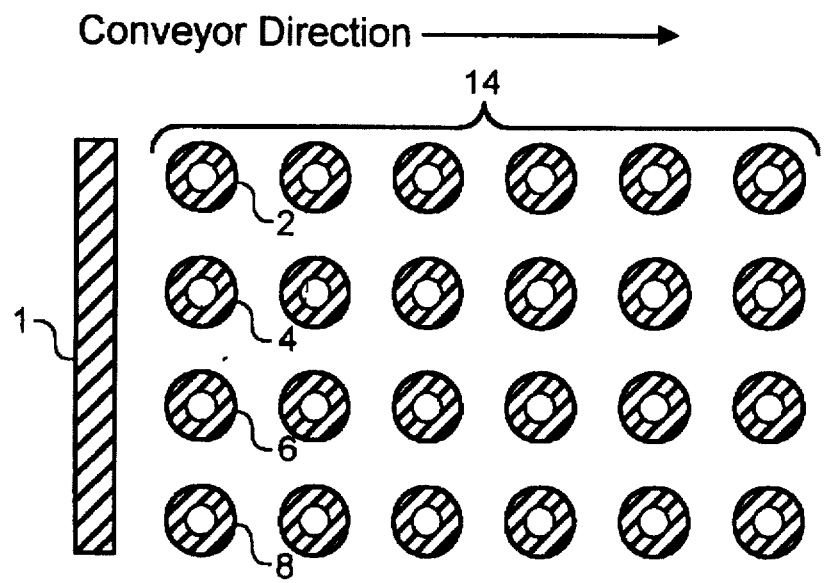
Figure 1D:
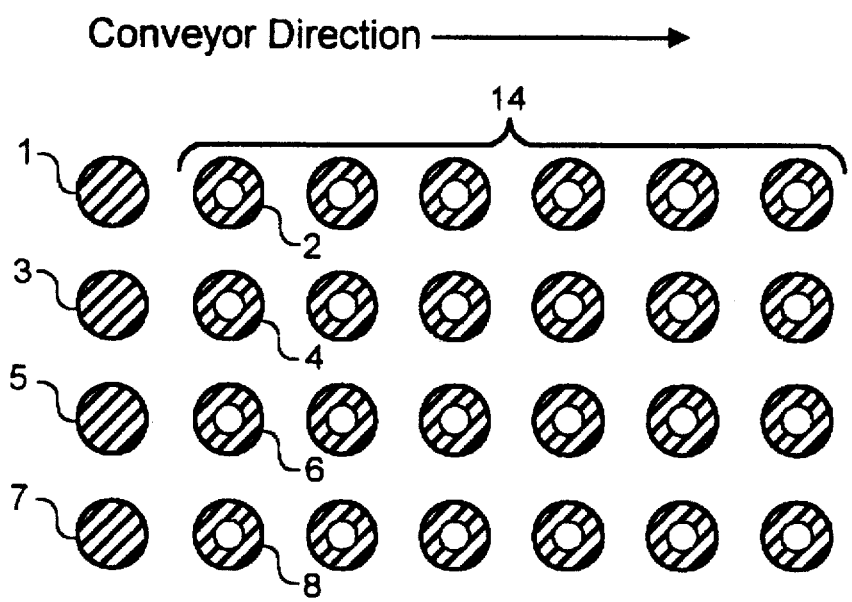
Figure 1E:
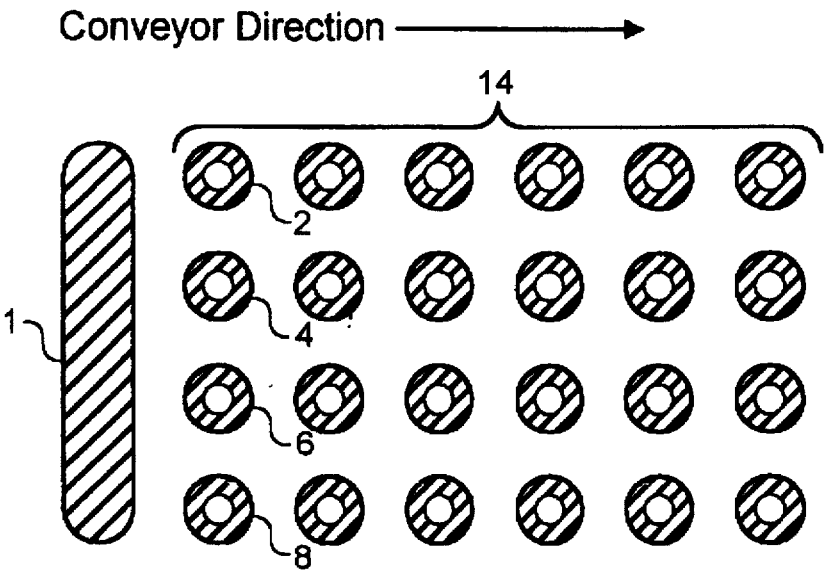
Figure 1F:
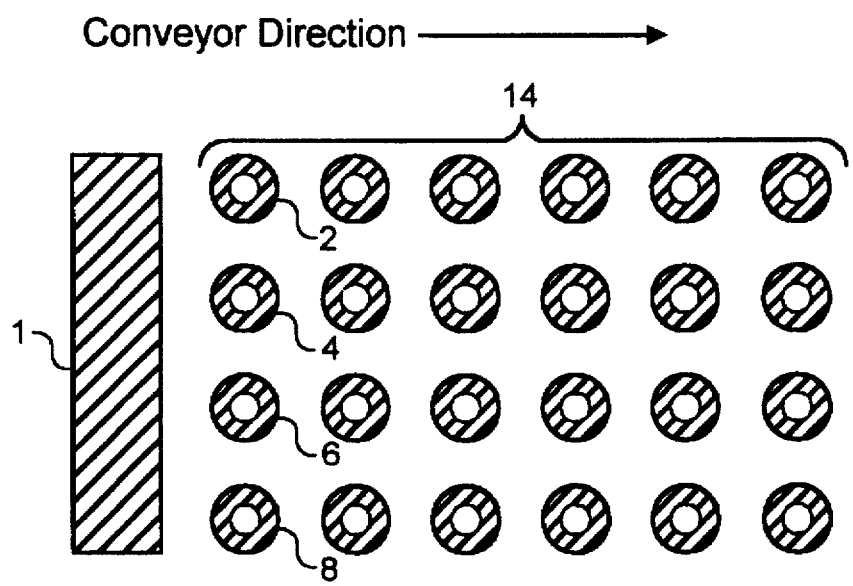
Figure 2:
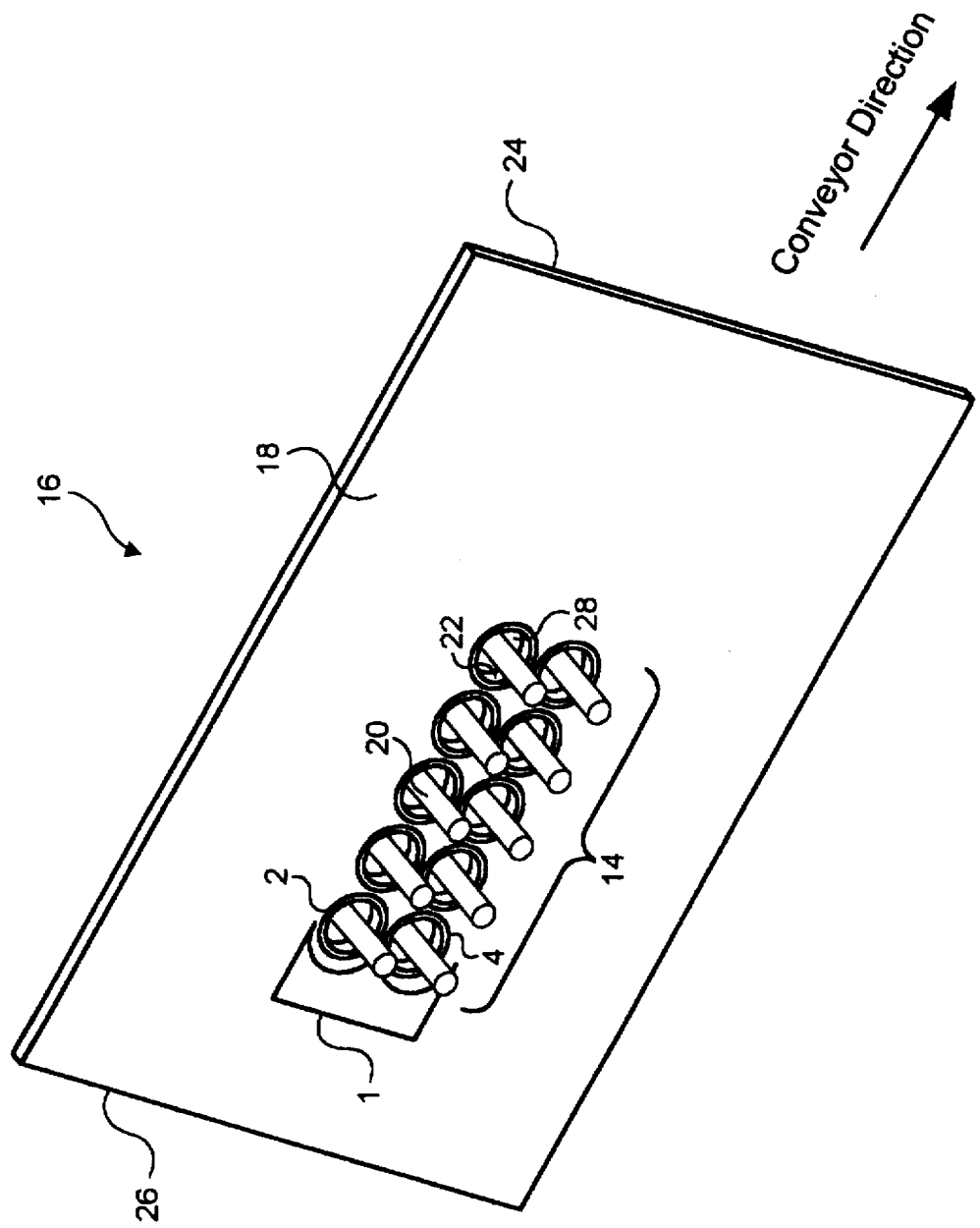
FIG. 2 is an isometric view of a printed circuit board with an anti-bridging pad disposed between the trailing pads of a functional pad array and the trailing edge of the board.

FIG. 2 illustrates a simplified embodiment of a printed circuit board 16 with an anti-bridging pad 1, a set of trailing pads 2 and 4 in an array of functional pads 14. Typically, anti-bridging pad 1, trailing pads 2 and 4, and array 14 would be smaller than illustrated with respect to the board 16 but have been enlarged for purposes of clarity. Before wave soldering the printed circuit board 16 travels on a conveyor belt (not shown) over molten solder wave (not shown) so the bottom surface 18 of the board 16 contacts the solder wave. Electrovert Hollis Automation Co. in Grand Prairie, Tex. manufactures one suitable wave soldering machine referred to as the UltraPak. The leading edge 24 of the board 16 enters the solder wave first and the trailing edge 26 exits last. The two trailing pads 2 and 4 exit the solder wave simultaneously. While contacting the board 16, molten solder flows into gaps between adjacent metal surfaces. In the pin-through-hole connections shown, the solder flows between a pin 20 and a barrel 22 (also shown in FIG. 3) residing in a hole 28 in the board 16 forming electrical connections between the pin 20 and the barrel 22 in the board 16. However, without the presence of an anti-bridging pad, some solder may remain between trailing pads 2 and 4 forming an electrical short. The anti-bridging pad 1 disposed between the trailing pads 2 and 4 and the trailing edge 26 serves to eliminate or greatly reduce solder bridging.

Figure 3:
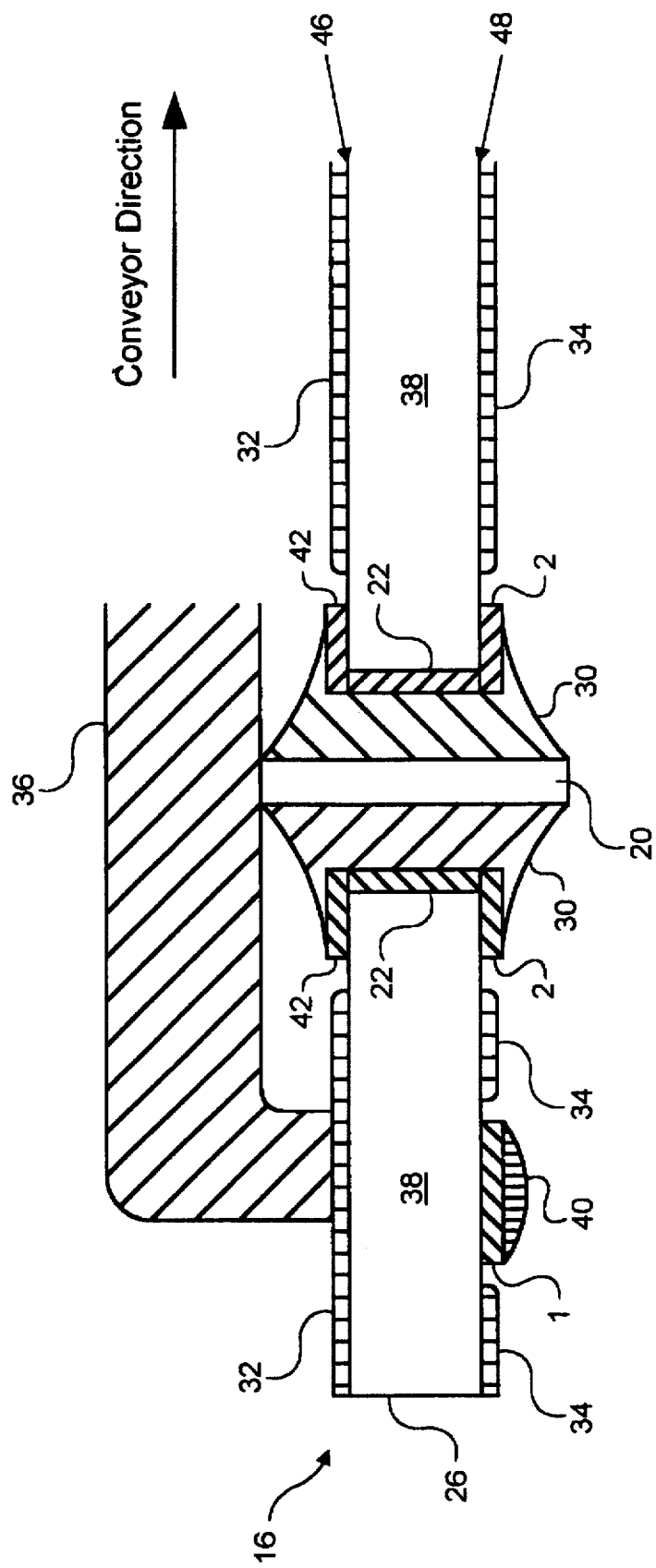
FIG 3 is a cross-sectional view of a printed circuit board with a pin-through-hole solder joint and an anti-bridging pad.

FIG. 3 is a cross-sectional view of part of a printed circuit board with a pin-through-hole solder joint and an anti-bridging pad between a trailing pad and the trailing edge of the board. As shown a plated conductive barrel 22 resides in a hole in the printed circuit board 16. The top of the barrel 22 can be the same height as the top surface 46 and the bottom of barrel 22 the same height as the bottom surface 48 of the insulating layer 38. This is due to a manufacturing choice rather than a requirement of the present invention. In one embodiment, the insulating layer 38 is coated with a conventional solder mask 32 on the top surface 46 and a solder mask 34 on the bottom surface 48. The solder mask 32, 34, provide a non-wettable surface, and seal and protect the printed circuit board 16. The barrel 22 is connected to a top annular ring 42 on the top surface 46 and a bottom annular ring 2 on the bottom surface 48. It should be noted that the bottom annular ring 2 is the trailing pad on the bottom surface 48 of the printed circuit board 16. The barrel 22 and rings 42 and 2 are electrically and physically integral with each other. An electronic component 36 with a plurality of pins is inserted into corresponding holes in the board 16 such as pin 20 is inserted in the barrel 22. During wave soldering, solder 30 fills between pin 20 and barrel 22 forming an electrical connection. An anti-bridging pad 1 disposed between pin 20 and the trailing edge 26 functions to greatly reduce or even eliminate solder bridging.

In one preferred embodiment, the barrel 22, the annular rings 42 and 2, and the anti-bridging pad 1 can be fabricated from copper plating as is known. The pin 20 can be a copper pin coated with conventional solder, a metal alloy, gold, or any other conductive materials which is wettable and preferably not readily oxidized. It is not considered essential to the present invention what type of solder wettable conductive material is used for the foregoing parts described in this paragraph or whether the anti-bridging pad 1 is or is not coated with solder prior to being wave soldered. However, solder 40 will typically coat the anti-bridging pad 1 after wave soldering.

Figure 4:
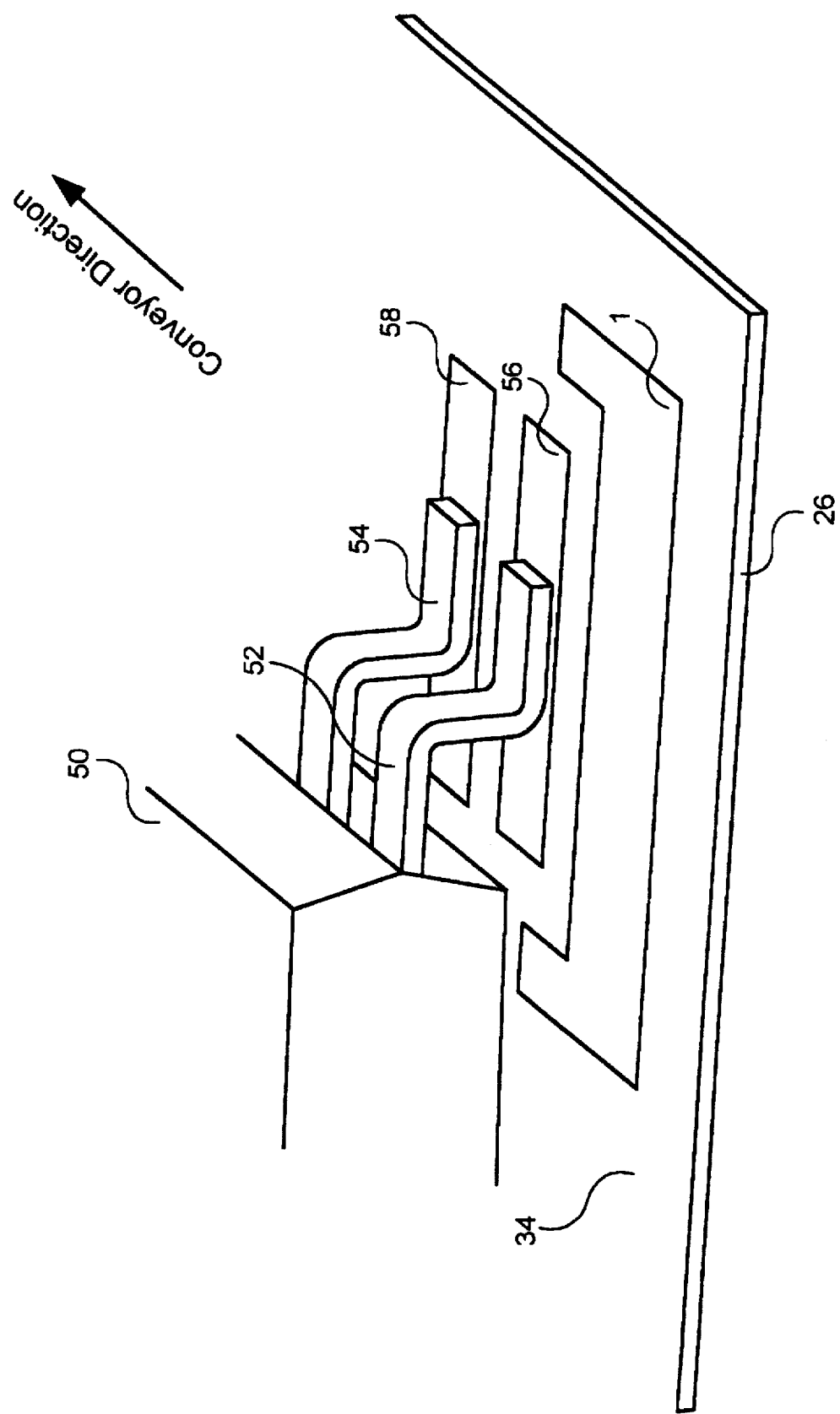
FIG. 4 is an isometric view of a portion of a printed circuit board with a surface mount component having a plurality of leads where at least one trailing lead is attached to a trailing solder pad and followed by an anti-bridging pad.

FIG. 4 is a perspective view of part of a surface mount component 50 having leads 52, 54, which are attached during wave soldering to the pads 56, 58, respectively, and surrounded by bottom side solder mask 34. Lead 52 and pad 56 are closest to the trailing edge 26 of the printed circuit board. Thus, pad 56 is referred to as a trailing pad. An anti-bridging pad 1 is disposed between the trailing pad 56 and trailing edge 26 of the printed circuit board.

An anti-bridging pad can be defined as an area on a printed circuit board bounded by an edge composed of a set of points. The edge can be intersected by a set of lines which are parallel to the conveyor direction. The leading edge of the anti-bridging pad by definition is that subset of points which will be intersected first by the lines when drawn from the leading edge to the trailing edge of the board and that subset of points on the edge of the anti-bridging pad which are parallel to the conveyor direction.

A trailing pad can be defined as an area on a printed circuit board bounded by an edge composed of a set of points. The edge can be intersected by a set of lines which are parallel to the conveyor direction. The trailing edge of the trailing pad by definition is that subset of points which will be intersected last by the lines when drawn from the leading edge to the trailing edge of the board and that subset of points on the edge of the trailing pad which are parallel to the conveyor direction.

Figure 5:
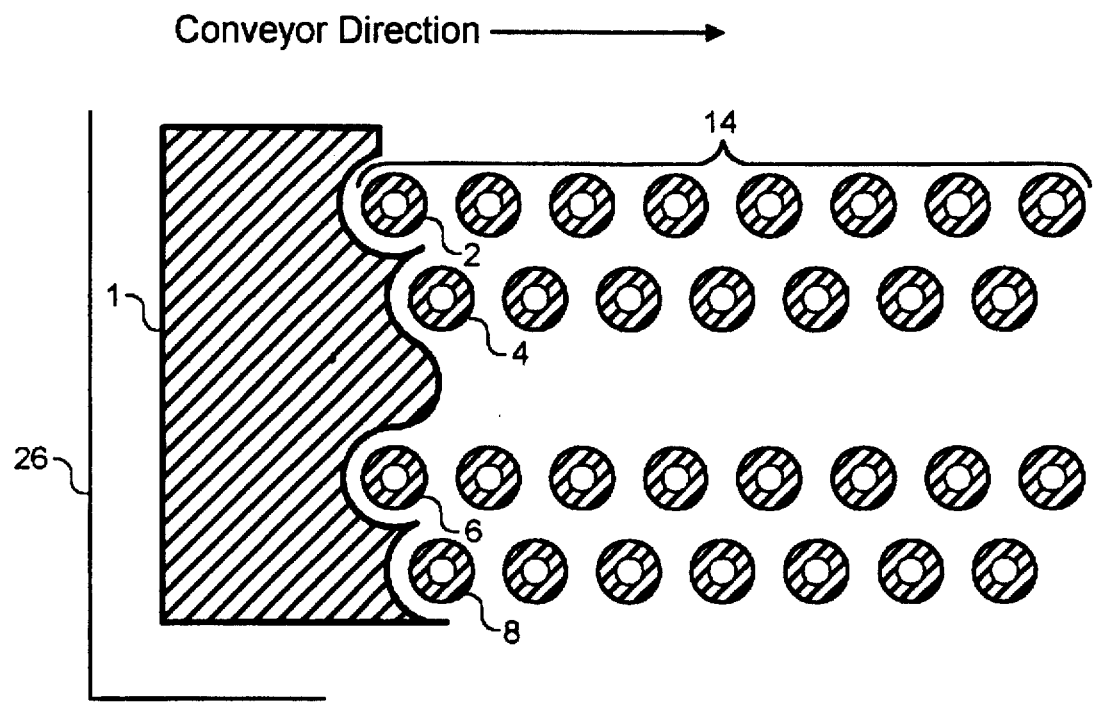
FIG. 5 illustrates an arrangement of the present invention for an anti-bridging pad disposed between the trailing pads of a functional pad array and the trailing edge of the board.

FIG. 5 illustrates a schematic arrangement of an anti-bridging pad with respect to trailing pads of an functional pad array in accordance with the present invention.

As shown in one embodiment, an anti-bridging pad 1 is disposed between the trailing pads 2, 4, 6, and 8 and the trailing edge 26 of the board, wherein an edge of the anti-bridging pad 1 substantially corresponds to at least one edge of trailing pads 2, 4, 6, and 8. Specifically, in the embodiment, the leading edge of the anti-bridging pad 1 substantially corresponds to the trailing edge of each of the trailing pads 2, 4, 6, and 8 of a functional pad array 14. In a preferred embodiment, at least one point on the edge of the anti-bridging pad 1 is less than 0.03 inches from the closest point of an edge of at least one of the trailing pads 2, 4, 6, and 8. As shown the anti-bridging pad 1 may include fingers, for example, outside trailing pad 2, between trailing pads 2 and 4, between trailing pads 4 and 6, between trailing pads 6 and 8, and beyond trailing pad 8. In the illustrated embodiment, the fingers include a point which is closer to a line intersecting the printed circuit board perpendicular to the conveyor direction and in front of trailing pad than a point on the associated trailing pad. It should be recognized that the overall structure and function of the single anti-bridging pad 1 as shown in FIG. 5 can be obtained from a plurality of anti-bridging pads.

Figure 6:
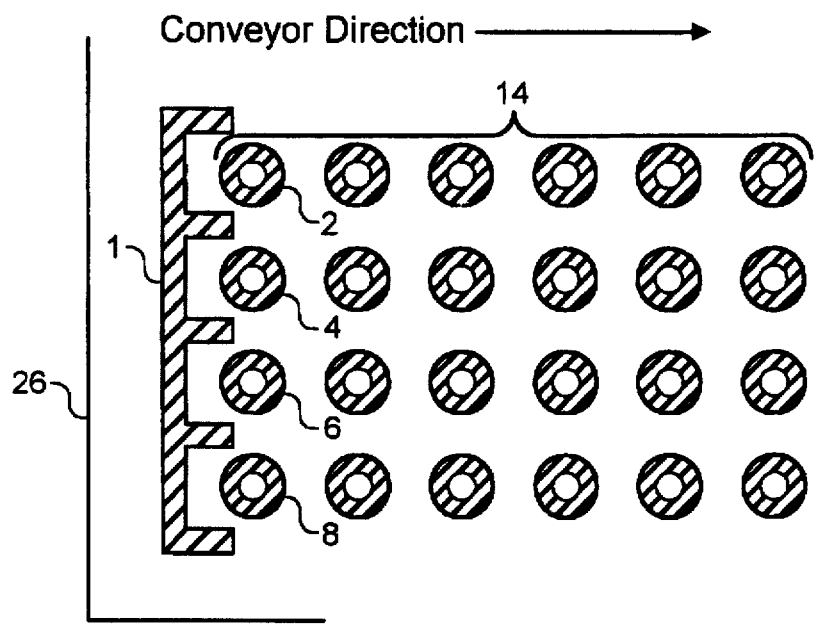
FIG. 6 illustrates another arrangement of the present invention for an anti-bridging pad disposed between the trailing pads of a functional pad array and the trailing edge of the board.

FIG. 6 illustrates a schematic arrangement of an anti-bridging pad with respect to trailing pads of an functional pad array in accordance with the present invention. As shown in one embodiment, an anti-bridging pad 1 is disposed between the trailing pads 2, 4, 6, and 8 and the trailing edge 26 of the board, wherein an edge of the anti-bridging pad 1 substantially corresponds to an edge of at least one of the trailing pads 2, 4, 6, and 8. Specifically, in the embodiment, the leading edge of the anti-bridging pad 1 substantially corresponds to the trailing edge of each of the trailing pads 2, 4, 6, and 8 of a functional pad array 14. In a preferred embodiment, at least one point on the edge of the anti-bridging pad 1 is less than 0.03 inches from the closest point of an edge of at least one of the trailing pads 2, 4, 6, and 8. As shown the anti-bridging pad 1 may include fingers, for example, outside trailing pad 2, between trailing pads 2 and 4, between trailing pads 4 and 6, between trailing pads 6 and 8, and beyond trailing pad 8. In the illustrated embodiment, the fingers include a point which is closer to a line intersecting the printed circuit board perpendicular to the conveyor direction and in front of the trailing pad than a point on the associated trailing pad. As shown the anti-bridging pad 1 may also be viewed as including a serrated edge of steps staggered with respect to the trailing pads 2, 4, 6, and 8. In the illustrated embodiment, the steps include a point which is closer to a line intersecting the printed circuit board perpendicular to the conveyor direction and in front of the trailing pad than a point on the associated trailing pad. It should be recognized that the overall structure and function of the single anti-bridging pad 1 as shown in FIG. 6 can be obtained from a plurality of anti-bridging pads.

Figure 7:
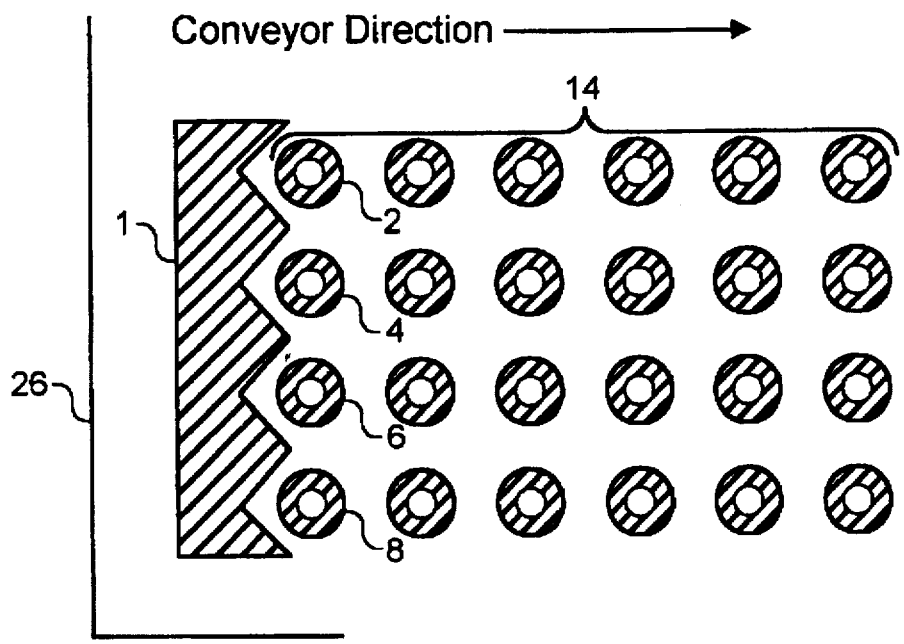
FIG. 7 illustrates another arrangement of the present invention for an anti-bridging pad disposed between the trailing pads of a functional pad array and the trailing edge of the board.

FIG. 7 illustrates a schematic arrangement of an anti-bridging pad with respect to trailing pads of an functional pad array in accordance with the present invention. As shown in one embodiment, an anti-bridging pad 1 is disposed between the trailing pads 2, 4, 6, and 8 and the trailing edge 26 of the board, wherein an edge of the anti-bridging pad 1 substantially corresponds to at least one edge of the trailing pads 2, 4, 6, and 8. Specifically, in the embodiment, the leading edge of the anti-bridging pad 1 substantially corresponds to the trailing edge of each of the trailing pads 2, 4, 6, and 8 of a functional pad array 14. In a preferred embodiment, at least one point on the edge of the anti-bridging pad 1 is less than 0.03 inches from the closest point of an edge of at least one of the trailing pads 2, 4, 6, and 8. As shown the anti-bridging pad 1 may include a serrated edge of sawtooths staggered with respect to the trailing pads 2, 4, 6, and 8. In the illustrated embodiment, the sawtooths include a point which is closer to a line intersecting the printed circuit board perpendicular to the conveyor direction and in front of the trailing pad than a point on the associated trailing pad. It should be recognized that the overall structure and function of the single anti-bridging pad 1 as shown in FIG. 7 can be obtained from a plurality of anti-bridging pads.

Figure 8:
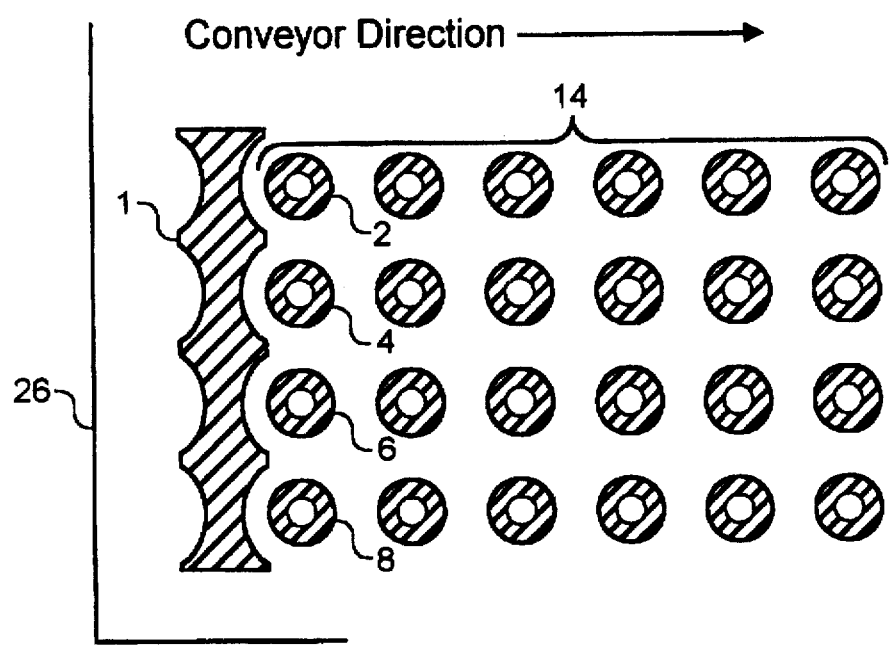
FIG. 8 illustrates another arrangement of the present invention for an anti-bridging pad disposed between the trailing pads of a functional pad array and the trailing edge of the board.

FIG. 8 illustrates a schematic arrangement of an anti-bridging pad with respect to trailing pads of an functional pad array in accordance with the present invention. As shown in one embodiment, an anti-bridging pad 1 is disposed between the trailing pads 2, 4, 6, and 8 and the trailing edge 26 of the board, wherein an edge of the anti-bridging pad 1 substantially corresponds to at least one edge of the trailing pads 2, 4, 6, and 8. Specifically, in the embodiment, the leading edge of the anti-bridging pad 1 substantially corresponds to the trailing edge of each of the trailing pads 2, 4, 6, and 8 of a functional pad array 14. In a preferred embodiment, at least one point on the edge of the anti-bridging pad 1 is less than 0.03 inches from the closest point of an edge of at least one of the trailing pads 2, 4, 6, and 8. In the illustrated embodiment, the fingers include a point which is closer to a line intersecting the printed circuit board perpendicular to the conveyor direction and in front of the trailing pad than a point on the associated trailing pad. As shown the anti-bridging pad 1 may be viewed as including a serrated edge of a plurality of curves, each curve mating with a corresponding one of the trailing pads 2, 4, 6, and 8. In the illustrated embodiment, the set of curves include a point which is closer to a line intersecting the printed circuit board perpendicular to the conveyor direction and in front of the trailing pad than a point on the associated trailing pad. It should be recognized that the overall structure and function of the single anti-bridging pad 1 as shown in FIG. 8 can be obtained from a plurality of anti-bridging pads.

From the above, one skilled in the art will understand that many modifications may be made to the printed circuit board and processes described herein without departing from the scope of the present invention. For example, although the specification illustrates the use of the anti-bridging pads on printed circuit boards, it has application to other types of interconnecting substrates. For example, the present invention can be also employed with ceramic cards and hybrid technology. Although the drawing FIGS. 5–8 have depicted four rows of functional pads perpendicular to the conveyor direction, the present invention may find application to a single row and a plurality of rows of functional pads arranged either parallel, or perpendicular, or at angle in between with respect to the conveyor direction. For example, applicant believes that a single row or more of functional pads may be nonparallel from the conveyor direction and followed by the anti-bridging pads described and still achieve favorable results.

What is claimed:

1. An interconnecting substrate suitable for wave soldering in a conveyor direction, the substrate including a leading edge and a trailing edge, comprising:

an electrically insulating layer;

an array of functional pads on the layer, wherein the array includes a trailing pad; and an anti-bridging pad spaced apart from the trailing pad and disposed between the trailing pad and the trailing edge of the substrate wherein at least one point on the edge of the anti-bridging pad is less than 0.03 inches from the closest point of the edge of trailing pad.

2. An interconnecting substrate suitable for wave soldering in a conveyor direction, the substrate including a leading edge and a trailing edge, comprising:

an electrically insulating layer;

an array of functional pads on the layer, wherein the array includes at least one row not on a 45° angle with respect to the output direction and wherein the array includes a trailing pad; and an anti-bridging pad spaced apart from the trailing pad and disposed between the trailing pad and the trailing edge of the substrate, wherein an edge of the anti-bridging pad substantially corresponds to an edge of the trailing pad.

3. An interconnecting substrate suitable for wave soldering in a conveyor direction, the substrate including a leading edge and a trailing edge, comprising:

an electrically insulating layer;

an array of functional pads on the layer, wherein the array includes a trailing pad; and an anti-bridging pad disposed between the trailing pad and the trailing edge of the substrate, wherein the anti-bridging pad includes a serrated edge facing the trailing pad.

4. An interconnecting substrate suitable for wave soldering in a conveyor direction, the substrate including a leading edge and a trailing edge, comprising:

an electrically insulating layer;

an array of functional pads on the layer including a trailing pad; and an anti-bridging pad including a finger with a point which is closer to a line intersecting the substrate perpendicular to the conveyor direction and in front of the trailing pad than a point on the trailing pad.

5. The interconnecting substrate of claim 1, 2, 3, or 4, wherein the edge of the anti-bridging pad includes at least one sawtooth.

6. The interconnecting substrate of claim 1, 2, 3, or 4, wherein the edge of the anti-bridging pad includes at least one curve.

7. The interconnecting substrate of claim 1, 2, 3, or 4, wherein the edge of the anti-bridging pad includes at least one step.

8. The interconnecting substrate of claim 1, 2, 3, or 4, wherein the array includes a plurality of trailing pads wherein the edge of the anti-bridging pad includes a plurality of curves, each of the plurality of curves mating with a corresponding trailing pad.

9. The interconnecting substrate of claim 1, 2, 3, or 4, wherein the array includes a plurality of trailing pads, wherein the edge of the anti-bridging pad includes a plurality of sawtooths staggered with respect to the trailing pads.

10. The interconnecting substrate of claim 1, 2, 3, or 4, wherein the array includes a plurality of trailing pads, wherein the edge of the anti-bridging pad includes a plurality of steps staggered with respect to the trailing pads.

11. The interconnecting substrate of claim 1, 2, 3, or 4, wherein at least part of the anti-bridging pad leads a point on the edge of the trailing pad.

12. The interconnecting substrate of claim 1, 2, 3, or 4, wherein the array includes a plurality of trailing pads, and wherein the anti-bridging solder pad extends along the entire trailing edge of the array.

13. The interconnecting substrate of claim 1, 2, 3, or 4, wherein the array includes a plurality of trailing pads, and wherein the anti-bridging pad extends along a part of the trailing edge of the array.

14. The interconnecting substrate of claim 1, 2, 3, or 4, wherein the array includes a plurality of trailing pads, and wherein the anti-bridging pad extends beyond the entire trailing edge of the array.

15. The interconnecting substrate of claim 1, 2, 3, or 4, wherein the anti-bridging pad is coated with solder.

* * * * *